United States Patent
Yanagawa et al.

(10) Patent No.: US 8,092,961 B2
(45) Date of Patent: Jan. 10, 2012

(54) POSITION ALIGNING APPARATUS, POSITION ALIGNING METHOD, AND SEMICONDUCTOR DEVICE MANUFACTURING METHOD

(75) Inventors: Yoshiaki Yanagawa, Kanagawa (JP); Yuki Okada, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 241 days.

(21) Appl. No.: 12/385,991

(22) Filed: Apr. 27, 2009

(65) Prior Publication Data
US 2009/0269685 A1    Oct. 29, 2009

(30) Foreign Application Priority Data

Apr. 28, 2008  (JP) ................ 2008-117109
Apr. 28, 2008  (JP) ................ 2008-117110

(51) Int. Cl.
*G03F 9/00* (2006.01)
(52) U.S. Cl. .......................... 430/22; 430/30
(58) Field of Classification Search ............ 430/22, 430/30
See application file for complete search history.

(56) References Cited

U.S. PATENT DOCUMENTS

| 7,220,521 B2 | 5/2007 | Kawamura |
| 2006/0028645 A1 | 2/2006 | Kawamura |
| 2007/0020537 A1 | 1/2007 | Harakawa et al. |

FOREIGN PATENT DOCUMENTS

| JP | 2006-073986 | 3/2006 |
| JP | 2007-027429 | 2/2007 |

*Primary Examiner* — Christopher Young
(74) *Attorney, Agent, or Firm* — McGinn IP Law Group, PLLC

(57) ABSTRACT

A position aligning apparatus performs position alignment of a pattern in a current process of a pattern exposure process by using a pattern formed before the current process. The position aligning apparatus includes: a correction calculating section configured to calculate a correction value set of a current lot about each of misalignments in scale and rotation of a pattern in a chip in the current process based on a correction value set in an immediately-preceding lot in the current process, a completeness value set in the immediately-preceding lot in the current process, a summation of completeness value sets in the immediately-preceding lot to a process immediately-preceding to the current process, and a summation of completeness value sets in the current lot to the immediately-preceding process; and a correction control unit configured to control correction of the scale and the rotation of the pattern in the chip by using the correction value sets.

12 Claims, 13 Drawing Sheets

Fig. 5A RELATED ART
Fig. 5B RELATED ART
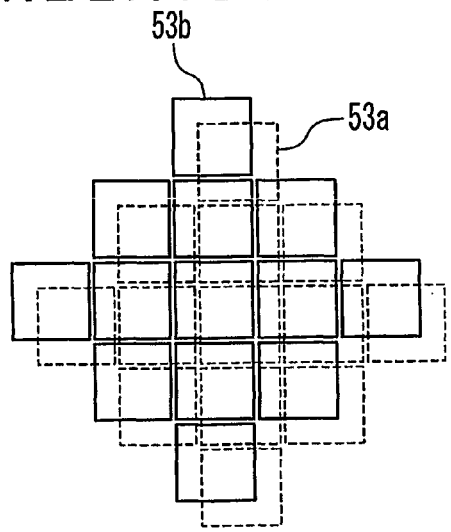
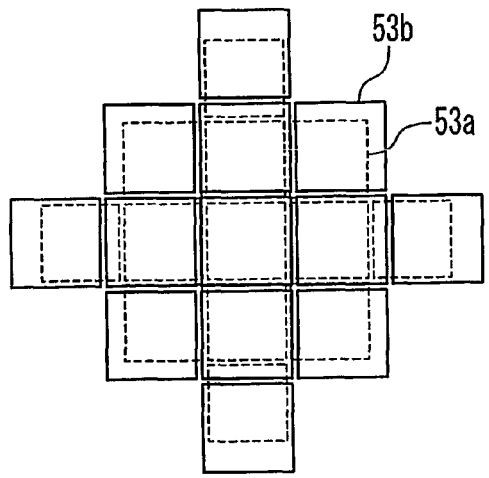
Fig. 5C RELATED ART
Fig. 5D RELATED ART
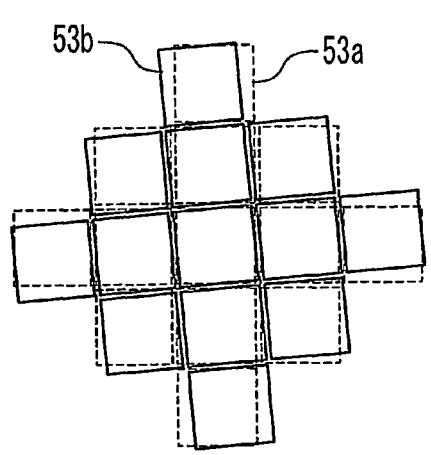
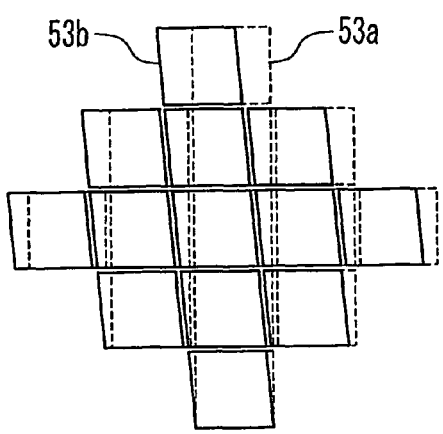

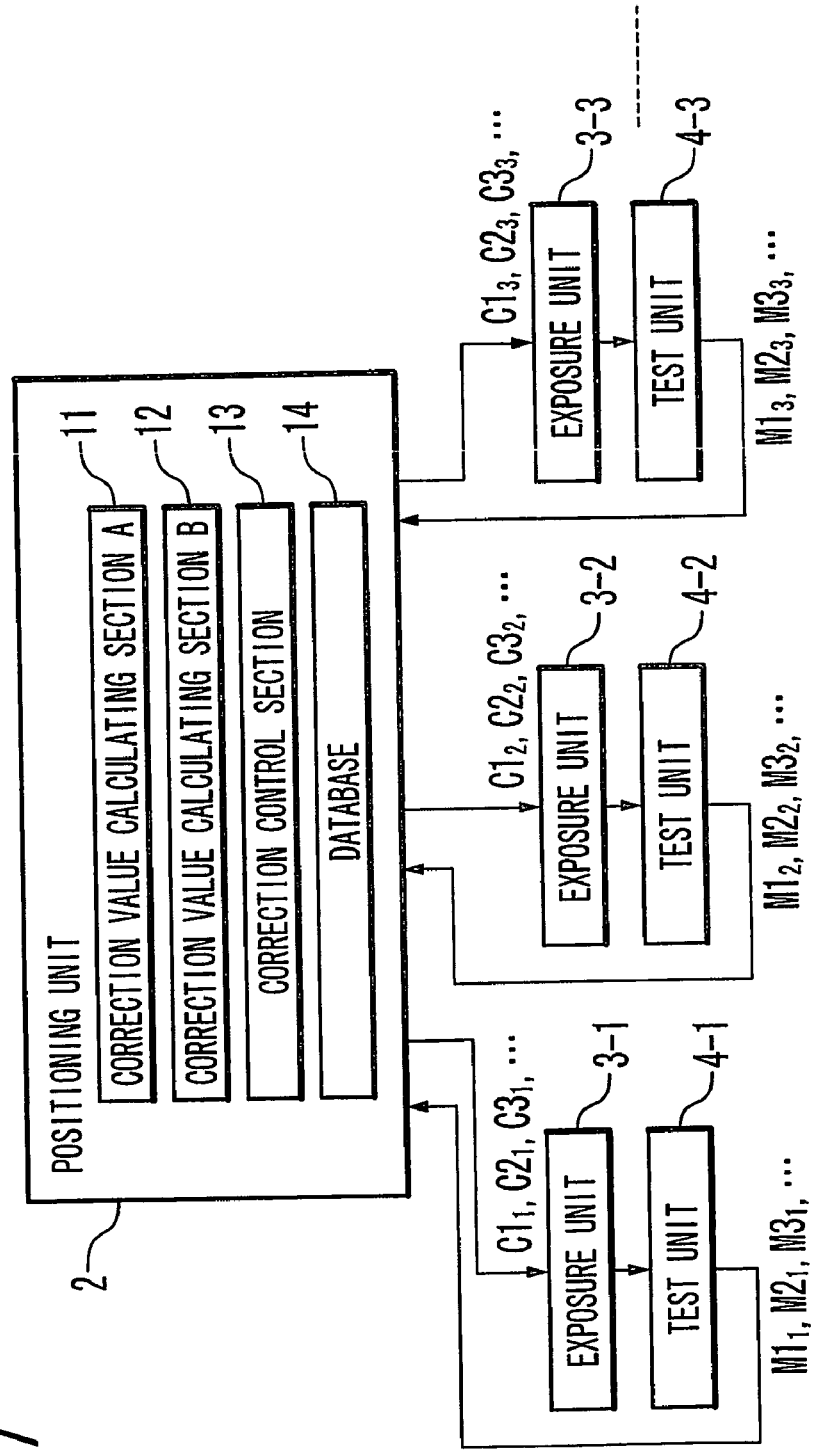

POSITION ALIGNING APPARATUS, POSITION ALIGNING METHOD, AND SEMICONDUCTOR DEVICE MANUFACTURING METHOD

INCORPORATION BY REFERENCE

This patent application claims priorities on convention based on Japanese Patent application Nos. 2008-117109 and 2008-117110. The disclosures thereof are incorporated herein by reference.

BACKGROUND OF THE INVENTION

1. Field of the Invention

The present invention relates to a position aligning apparatus, a position aligning method, and a semiconductor device manufacturing method. Especially, the present invention relates to a position aligning apparatus, a position aligning method, and a semiconductor device manufacturing method, which are used for a position alignment of a pattern in a pattern exposure process.

2. Description of Related Art

An exposure process in which a mask pattern is aligned on a semiconductor wafer and then the wafer is exposed is executed in a photolithography process of a semiconductor device manufacturing method. The exposure process requires an operation of accurately position-aligning a mask pattern to be used next on a pattern provided on the semiconductor wafer. The position alignment is carried out by using a position aligning mark formed on the semiconductor wafer.

FIG. 1 is a schematic diagram showing an example of a semiconductor wafer in manufacturing a semiconductor device. A semiconductor wafer 50 has a region 51 for semiconductor chips. The region 51 includes a plurality of chip regions 53 and a plurality of scribe regions 54. The plurality of chip regions 53 are arranged on an approximate matrix, and serve as semiconductor chips (semiconductor devices), respectively. The plurality of scribe regions 54 are provided between every adjacent two of the plurality of chip regions 53, and the wafer is scribed at the positions when the semiconductor chip has been manufactured.

FIG. 2 is a schematic diagram showing an example of a region 52 (a region surrounded by a dashed line) in FIG. 1. In the region 52, the scribe regions 54 around the chip region 53 have position aligning marks 61 and position aligning check marks 62 and 63, as marks for the above-mentioned position alignment. The position aligning mark 61 is used to superpose a mask pattern on a pattern provided on the semiconductor wafer by an exposing apparatus. The position aligning check mark 62 is provided almost directly above the position aligning check mark 63 of the pattern on a lower side on the semiconductor wafer. The position aligning check mark 62 is used for checking completeness of the pattern, the completeness being degree of misalignment of a pattern formed through this position alignment from an appropriate position based on a position relation with the position aligning check mark 63 of the pattern on the lower side. A value showing the degree of misalignment of the pattern formed at this position alignment from an appropriate position is, for example, called a completeness value.

FIG. 3 is a cross sectional view showing an example of the scribe region 54 in FIG. 2. In the semiconductor device, a plurality of layers 70 are generally stacked. The respective layers are provided with the position aligning marks 61 and the position aligning check marks 62 and 63. In this example, layers 70-1 to 70-6 are stacked. In addition, the layer 70-1 has a position aligning mark 61-1 and position aligning check marks 62-1 and 63-1. Similarly, the layers 70-2 to 70-6 have the position aligning marks 61-2 to 61-6 and the position aligning check marks 62-2 to 62-6 and 63-2 to 63-6, respectively. In the semiconductor device in this example, the position aligning mark 61 is formed in all of the layers 70. Specifically, the each layer 70 is formed in a "direct position aligning" process of superposing a mask pattern on a pattern provided on a semiconductor wafer by using the position aligning mark 61 on a layer lower by one layer. For example, in case of forming the layer 70-3, the mask pattern is superposed on the pattern provided on the semiconductor wafer by using the position aligning check mark 61-2 on the layer 70-2 lower by one layer.

FIG. 4 is a cross sectional view showing another example of the scribe region 54 in FIG. 2. In comparison with FIG. 3, the position aligning mark 61 is not necessarily formed in all the layers 70 in this example. For example, while the position aligning mark 61 is formed in the layers 70-1, 70-3, and 70-5, the mark is not formed in other layers 70-2, 70-4, and 70-6. This means that the layers 70-2, 70-4, and 70-6 are formed in the above-mentioned direct position aligning process. However, the layers 70-3 and 70-5 are formed in an "indirect position aligning" process in which the exposure apparatus superposes a mask pattern on a pattern provided on the semiconductor wafer by using the position aligning mark 61 other than the position aligning mark 61 on a layer lower by one layer. For example, in case of forming the layer 70-3, since there is not the position aligning mark 61 on the layer 70-2 lower by one layer, the mask pattern is superposed on the pattern provided on the semiconductor wafer by using the position aligning mark 61-1 on the layer 70-1 lower by two layers.

In the above-mentioned position aligning process of superposing the mask pattern on the pattern provided on the semiconductor wafer, it is known that several types of position misalignment occur. FIGS. 5A to 5D and 6A to 6C are schematic diagrams showing examples of the position misalignment occurring in the position alignment. The drawings show that chip regions 53a (dashed lines) are in a lower layer and that chip regions 53b (solid lines) are in an upper layer. As the types of position misalignment, two types exist: one is a position misalignment shown in FIGS. 5A to 5D, regarding the whole of a plurality of chip regions 53, and the other is the position misalignment shown in FIGS. 6A to 6C, regarding the respective regions 53. Specifically, as the position misalignment regarding the whole of the plurality of chip regions 53, three types exist; the first is a shift misalignment in an X and a Y directions (ShiftX and ShiftY) shown in FIG. 5A, the second is a scale misalignment in the X and the Y directions (WaferScaleX and WaferScaleY) shown in FIG. 5B, and the third is a rotation misalignment in the X and the Y directions (WaferRotation X and WaferRotation Y) shown in FIGS. 5C and 5D. As the position misalignment regarding the respective regions 53, two types exist; one is a scale misalignment in the X and the Y directions (ShotScaleX and ShotScaleY) shown in FIG. 6A, and the other is a rotation misalignment in the X and the Y directions (ShotRotation X and ShotRotation Y) shown in FIGS. 6B and 6C.

There are proposed various types of methods of correcting the position misalignment and suppressing their influences, when the exposure apparatus superposes a mask pattern on a pattern provided on the semiconductor wafer. As such a correcting method, Japanese Patent Application Publication (JP-P2006-73986A corresponding U.S. Pat. No. 7,220,521 B2) discloses a method of manufacturing a semiconductor device. The method of manufacturing the semiconductor device intends to improve accuracy of estimating a correction parameter set to the exposure apparatus for the position misalignment of a chip balance center other than the shift misalignment (ShiftX and ShifY). The method of manufacturing the semiconductor device includes an exposure process of: forming a lower-side pattern by a first exposure; and forming an upper-side pattern by a second exposure. The method of manufacturing the semiconductor device includes: a first exposure process of, in an immediately-preceding lot for which the exposure process is carried out immediately before a current lot, aligning a position of the upper-side pattern with respect to the lower-side pattern on a processed substrate on which the lower-side pattern is formed by the first exposure and exposing the processed substrate by the second exposure; and a second exposure process of, in the current lot, aligning a position of the upper-side pattern with respect to the lower-side pattern on the processed substrate on which the lower-side pattern is formed by the first exposure and exposing the processed substrate by the second exposure. Moreover, the method includes: a process of obtaining a first correction value indicating a difference between a first setting value of position misalignment correction parameter (P0set (ChipMagX, Lj) and a second setting value of position misalignment correction parameter (P0set (ChipMagX, Lj−1) each of which was used for aligning the position of the lower-side pattern in exposing the lower-side pattern on a current lot (Lj) and an immediately-preceding lot (Lj−1); a process of obtaining an optimum correction value (P1result (ChipMagX, Lj−1)) required to accurately align the position of the upper-side pattern as a second correction value with respect to a third setting value of position misalignment correction parameter (P1set (ChipMagX, Lj−1) used in exposing the upper-side pattern on the immediately-preceding lot (Lj−1), a process of obtaining an estimation value of optimum correction parameter (Estimate (ChipMagX, Lj)) used in exposing the upper-side pattern on the current lot (Lj) on the basis of the first correction value and the second correction value, and a process of carrying out exposure by using the estimation value of optimum correction parameter when the upper-side pattern is exposed on the current lot in the second exposure process.

In addition, Japanese Patent Application Publication (JP-P2007-27429A corresponding US Patent Application Publication (US 2007/020537 A1)) discloses an exposure apparatus correcting system, an exposure apparatus correcting method, and a method of manufacturing a semiconductor device. The exposure apparatus correcting system includes a misalignment calculating section, an approximating section, a rounding section, a back-calculating section, a residual calculating section, an estimation amount memory section, and a control section. The misalignment calculating section calculates position misalignment between a transcribed first test pattern and a second test pattern transcribed after its position has been aligned to the first test pattern. The approximating section approximates a relation between the position misalignment and a coordinate system including the second test pattern by using a plurality of parameters. The rounding section rounds a plurality of parameters within an effective range restricted by the exposure apparatus that transcribed the second test pattern. The back-calculating section calculates misalignment between the first test pattern and the second test pattern by using the rounded value as an estimated amount. The residual calculating section subtracts the calculated misalignment from the position misalignment. The estimation amount memory section stores an estimated amount. The control section corrects the exposure apparatus on the basis of summation of the estimated amount stored in the estimation amount memory section to reduce the position misalignment.

In recent years, as a progress of a finer process in a semiconductor integrated circuit, a technique is demanded which can carry out position alignment with high accuracy. To carry out the position alignment with high accuracy, it is required to improve an accuracy of correction of position misalignment. Meanwhile, as the semiconductor integrated circuit is highly integrated, the number of TEGs (Test Element Group) to be mounted increases and multilayer wiring has been used. Since the number of marks for position alignment is reduced due to an increase of the number of the TEGs, the above-mentioned indirect position aligning process has been introduced. Additionally, when the multilayer wiring has been used, stress applied to a semiconductor wafer varies in a manufacturing process. Variations of completeness between lots cannot be ignored in order to carry out the position alignment with extremely-high accuracy in such a situation. However, a conventional method of correcting the position misalignment (for example, Japanese Application Patent Publication (JP-P2006-73986A)) considers variations between processes but does not consider the variations of completeness between such lots. For this reason, it is believed that the position alignment with extremely-high accuracy is difficult. A technique is desired which can carry out the position alignment with higher accuracy in both of the direct position aligning process and the indirect position aligning process.

[Citation List]
 [Patent Literature]
  [PTL 1] JP-P2006-073986A
  [PTL 2] JP-P2007-027429A

SUMMARY

In an aspect of the present invention, a position aligning apparatus performs position alignment of a pattern in a current process of a pattern exposure process by using a pattern formed before the current process. The position aligning apparatus includes: a correction calculating section configured to calculate a correction value set of a current lot about each of misalignments in scale and rotation of a pattern in a chip in the current process based on a correction value set in an immediately-preceding lot in the current process, a completeness value set in the immediately-preceding lot in the current process, a summation of completeness value sets in the immediately-preceding lot to a process immediately-preceding to the current process, and a summation of completeness value sets in the current lot to the immediately-preceding process; and a correction control unit configured to control correction of the scale and the rotation of the pattern in the chip by using the correction value sets.

In another aspect of the present invention, a position aligning apparatus performs position alignment of a pattern in a current process of a pattern exposure process by using a pattern formed before an immediately-preceding process to the current process. The position aligning apparatus includes: a correction calculating section configured to calculate a correction value set of a current lot about each of misalignments in shift, scale and rotation of a pattern in a chip in the current process based on a correction value set in an immediately-preceding lot in the current process, a completeness value set in the immediately-preceding lot in the current process, a completeness value set in the immediately-preceding lot in the immediately-preceding process, and a completeness value set in the current lot to the immediately-preceding process; and a correction control unit configured to control correction of the shift, the scale and the rotation of the pattern in the chip by using the correction value sets.

In still another aspect of the present invention, in a position aligning method, position alignment of a pattern in a current process of a pattern exposure process is performed by using a pattern formed before the current process. The position aligning method is achieved by calculating a correction value set of a current lot about each of misalignments in scale and rotation of a pattern in a chip in the current process based on a correction value set in an immediately-preceding lot in the current process, a completeness value set in the immediately-preceding lot in the current process, a summation of completeness value sets in the immediately-preceding lot to a process immediately-preceding to the current process, and a summation of completeness value sets in the current lot to the immediately-preceding process; and by controlling correction of the scale and the rotation of the pattern in the chip by using the correction value sets.

In yet still another aspect of the present invention, in a position aligning method, position alignment of a pattern in a current process of a pattern exposure process is performed by using a pattern formed before an immediately-preceding process to the current process. The position aligning method is achieved by calculating a correction value set of a current lot about each of misalignments in shift, scale and rotation of a pattern in a chip in the current process based on a correction value set in an immediately-preceding lot in the current process, a completeness value set in the immediately-preceding lot in the current process, a completeness value set in the immediately-preceding lot in the immediately-preceding process, and a completeness value set in the current lot to the immediately-preceding process; and by controlling correction of the shift, the scale and the rotation of the pattern in the chip by using the correction value sets.

In another aspect of the present invention, a method of manufacturing a semiconductor device, is achieved by position aligning a pattern of a semiconductor wafer in a current process of a pattern exposure process is performed by using a pattern formed before the current process; and by exposing the semiconductor wafer. The position aligning may be achieved by calculating a correction value set of a current lot about each of misalignments in scale and rotation of a pattern in a chip in the current process based on a correction value set in an immediately-preceding lot in the current process, a completeness value set in the immediately-preceding lot in the current process, a summation of completeness value sets in the immediately-preceding lot to the immediately-preceding process, and a summation of completeness value sets in the current lot to the immediately-preceding process; and by controlling correction of the shift, scale and the rotation of the pattern in the chip by using the correction value sets.

In another aspect of the present invention, a method of manufacturing a semiconductor device, is achieved by position aligning a pattern of a semiconductor wafer in a current process of a pattern exposure process is performed by using a pattern formed before an immediately-preceding process to the current process; and by exposing the semiconductor wafer. The position aligning is achieved by calculating a correction value set of a current lot about each of misalignments in shift, scale and rotation of a pattern in a chip in the current process based on a correction value set in an immediately-preceding lot in the current process, a completeness value set in the immediately-preceding lot in the current process, a completeness value set in the immediately-preceding lot in the immediately-preceding process, and a completeness value set in the current lot to the immediately-preceding process; and by controlling correction of the shift, the scale and the rotation of the pattern in the chip by using the correction value sets.

According to the present invention, the position alignment can be carried out with higher accuracy in both of a direct position aligning process and an indirect position aligning process.

BRIEF DESCRIPTION OF THE DRAWINGS

The above and other objects, advantages and features of the present invention will be more apparent from the following description of certain embodiments taken in conjunction with the accompanying drawings, in which:

FIGS. 5A to 5D are diagrams showing position misalignment occurring in position alignment;

FIG. 7 is a block diagram showing a configuration of an exposure system including a position aligning apparatus according to an embodiment of the present invention;

DESCRIPTION OF THE PREFERRED EMBODIMENTS

Hereinafter, a position aligning apparatus, a position aligning method, and a semiconductor device manufacturing method according to the present invention will be described below with reference to the attached drawings.

At first, an exposure system including the position aligning apparatus according to an embodiment of the present invention will be described. FIG. 7 is a block diagram showing the configuration of the exposure system including the position aligning apparatus according to the embodiment of the present invention. An exposure system 1 includes a position aligning apparatus 2, exposing units 3-1 to 3-n (n is a natural number, and is same in the following description), and test units 4-1 to 4-n. Here, FIG. 7 shows the exposing units 3-1 to 3-3 and the test units 4-1 to 4-3.

The position aligning apparatus 2 controls operations of the exposing units 3-1 to 3-n and the test units 4-1 to 4-n in a plurality of exposure processes in a manufacturing process of the semiconductor device. A position alignment program of the present invention for a position aligning method to be described later is installed from a storage medium (not shown) into an information processing unit exemplified by a computer having an input-output unit, a central processing unit, and a storage device, which are not shown, in order to serve as the position aligning apparatus 2 of the present invention. The position aligning apparatus 2 includes a correction value calculating section A 11, a correction value calculating section B 12, a correction control section 13, and a database 14.

In each of the exposure processes, the correction value calculating section A 11 refers to the database 14 to calculate an exposure correction value set used in the exposure process based on predetermined data. The exposure correction value set includes exposure correction values C(ShiftX) and C(ShiftY) for a shift misalignment in an X direction or a Y direction (for example, shown in FIG. 5A), exposure correction values C(WaferScaleX) and C(WaferScaleY) for a scale misalignment in the X and the Y directions (for example, shown in FIG. 5B), and exposure correction values C(WaferRotationX) and C(WaferRotationY) for a rotation misalignment in the X and the Y directions (for example, shown in FIGS. 5C and 5D). The correction value calculating section A 11 calculates the exposure correction value set for both of a direct position aligning process and an indirect position aligning process. A calculation method thereof will be described below.

Figure 6A:
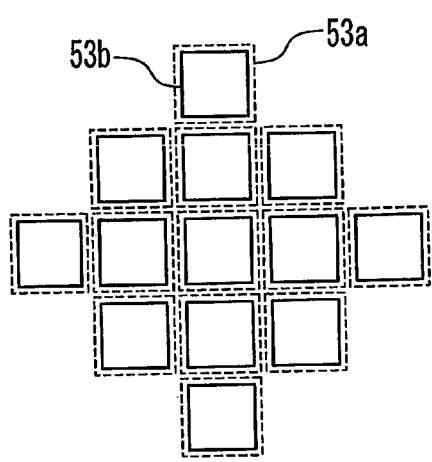
FIGS. 6A to 6C are diagrams showing position misalignment occurring in position alignment.
Figure 6B:
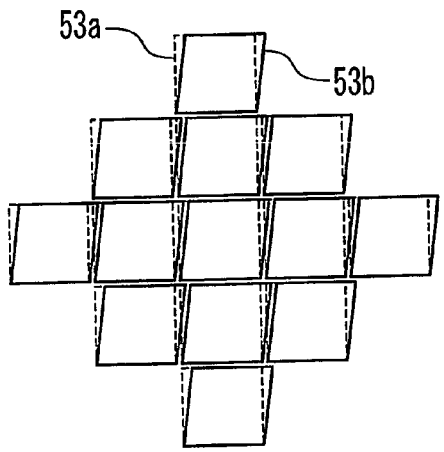
Figure 6C:
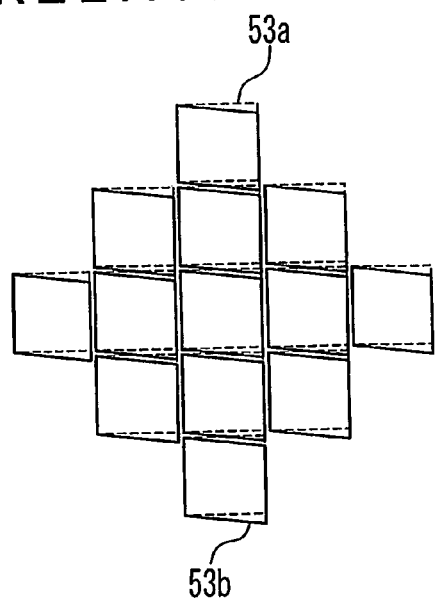

In each of the exposure processes, the correction value calculating section B 12 refers to the database 14 to calculate an exposure correction value set used in the respective exposure process based on predetermined data. The exposure correction value set includes exposure correction values C(ShotScaleX) and C(ShotScaleY) for a scale misalignment in the X and the Y directions (for example, shown in FIG. 6A); and exposure correction values C(ShotRotationX) and C(ShotRotationY) for a rotation misalignment in the X and the Y directions (for example, shown in FIGS. 6B and 6C). The correction value calculating section B 12 calculates the exposure correction value set for both of the direct position aligning process and the indirect position aligning process. A calculation method thereof will be described below.

In the $j^{th}$ exposure process ($1 \leq j \leq n$, j is a natural number), the correction control section 13 outputs the exposure correction value set C calculated by the correction value calculating section A 11 and the correction value calculating section B 12 to an exposing unit 3-$j$ used in the exposure process. In this regard, the exposure correction values C(ShiftX), C(ShiftY), C(WaferScaleX), C(WaferScaleY), C(WaferRotationX), C(WaferRotationY), C(ShotScaleX), C(ShotScaleY), C(ShotRotationX), and C(ShotRotationY) are collectively represented as the exposure correction value set C.

Additionally, in the $j^{th}$ exposure process, the correction control section 13 receives a completeness value set M detected by the test unit 4-$j$ used in the exposure process. However, the completeness value set M collectively represents completeness values M(ShiftX) and M(ShiftY) for the shift misalignment in the X and the Y directions (for example, shown in FIG. 5A); completeness values M(WaferScaleX) and M(WaferScaleY) for the scale misalignment in the X and the Y directions (for example, shown in FIG. 5B); completeness values M(WaferRotationX) and M(WaferRotationY) for the rotation misalignment in the X and the Y directions (for example, shown in FIGS. 5C and 5(d)); completeness values M(ShotScaleX) and M(ShotScaleY) for the scale misalignment in the X and the Y directions (for example, shown in FIG. 6A); and completeness values M(ShotRotationX) and M(ShotRotationY) for the rotation misalignment in the X and the Y directions (for example, shown in FIGS. 6B and 6C).

The correction control section 13 stores the exposure correction value set C and the completeness value set M to the database 14 by relating the value sets to the exposure process (the $j^{th}$ exposure process) or the exposing unit (the exposing unit 3-$j$) and to a lot number (an $i^{th}$ lot) of a semiconductor wafer to be exposed.

The database 14 stores the exposure correction value set C and the completeness value set M by relating the value sets to the exposure process (the $j^{th}$ exposure process) or the exposing unit (the exposing unit 3-$j$) and to the lot number (the $i^{th}$ lot). In addition, the database 14 stores data necessary for the exposure process (the position aligning method).

The exposing units 3-1 to 3-$n$ correct the position misalignment on the basis of the exposure correction value set C supplied from the position aligning apparatus 2 and carries out exposure to the semiconductor wafer in the $1^{st}$ to $n^{th}$ exposure processes, respectively. Specifically, the $j^{th}$ exposing unit 3-$j$ corrects the position misalignment of a mask pattern on the basis of an exposure correction value set Cij and carries out the exposure for the semiconductor wafer in the exposure process of the semiconductor wafer of the $i^{th}$ lot. In this regard, the exposure correction value set C used in the $j^{th}$ exposure process (the exposing unit 3-$j$) for the $i^{th}$ lot is referred to as Cij.

Figure 1:
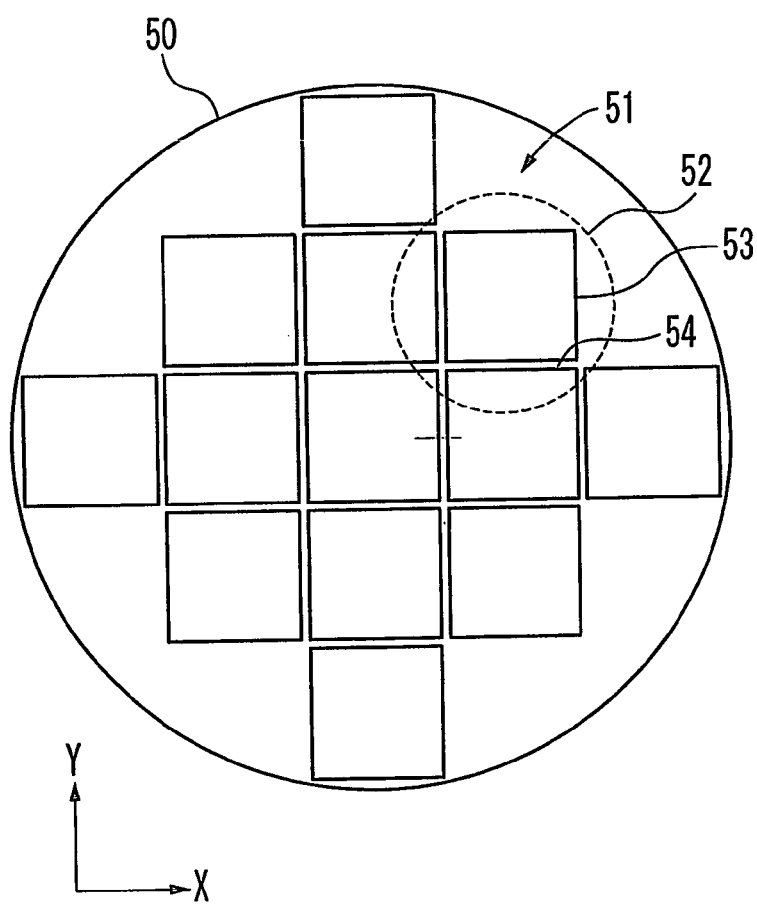
FIG. 1 is a diagram schematically showing one example of a semiconductor wafer in manufacturing a semiconductor device.
Figure 2:
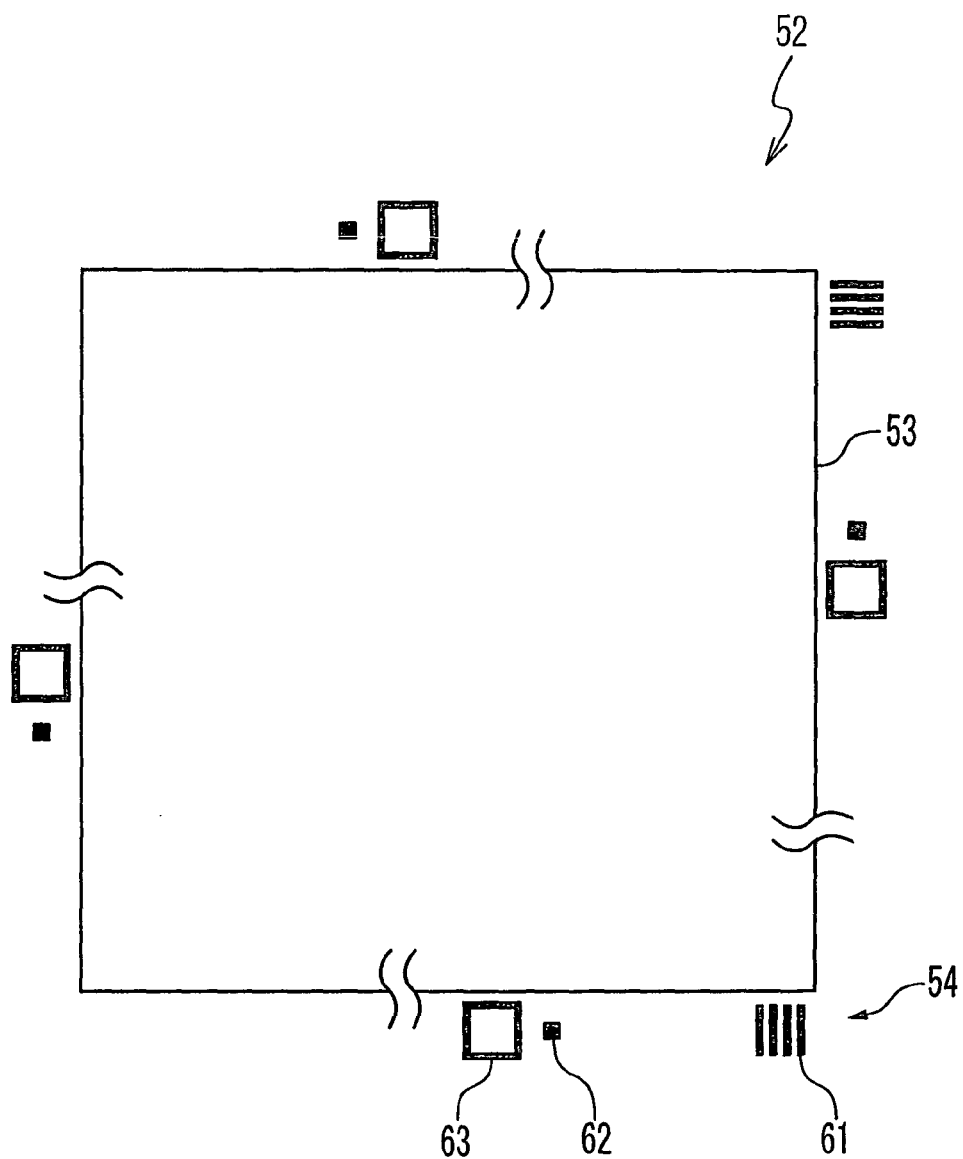
FIG. 2 is a diagram schematically showing one example of a region 52 (a region surrounded by a dashed line) in FIG. 1.
Figure 3:
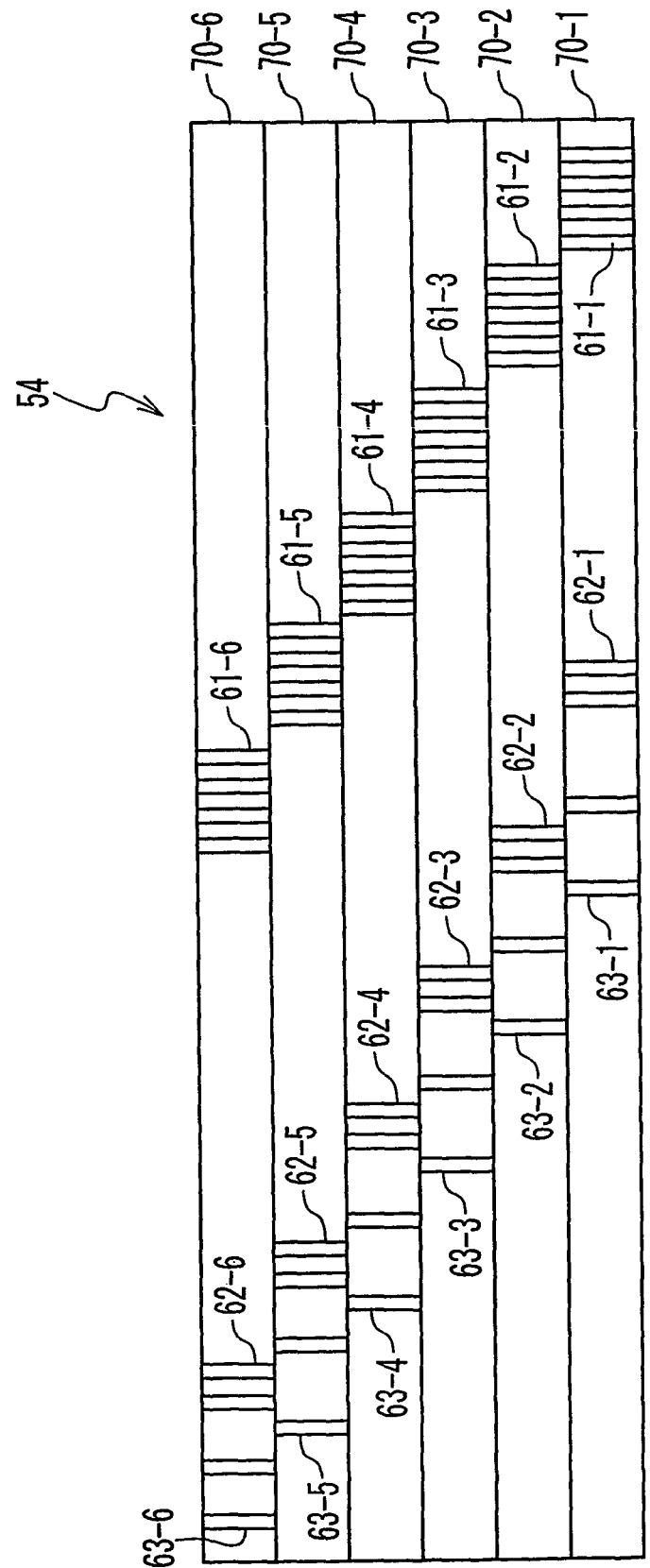
FIG. 3 is a cross sectional view showing one example of a scribe region 54 in FIG. 2.
Figure 4:
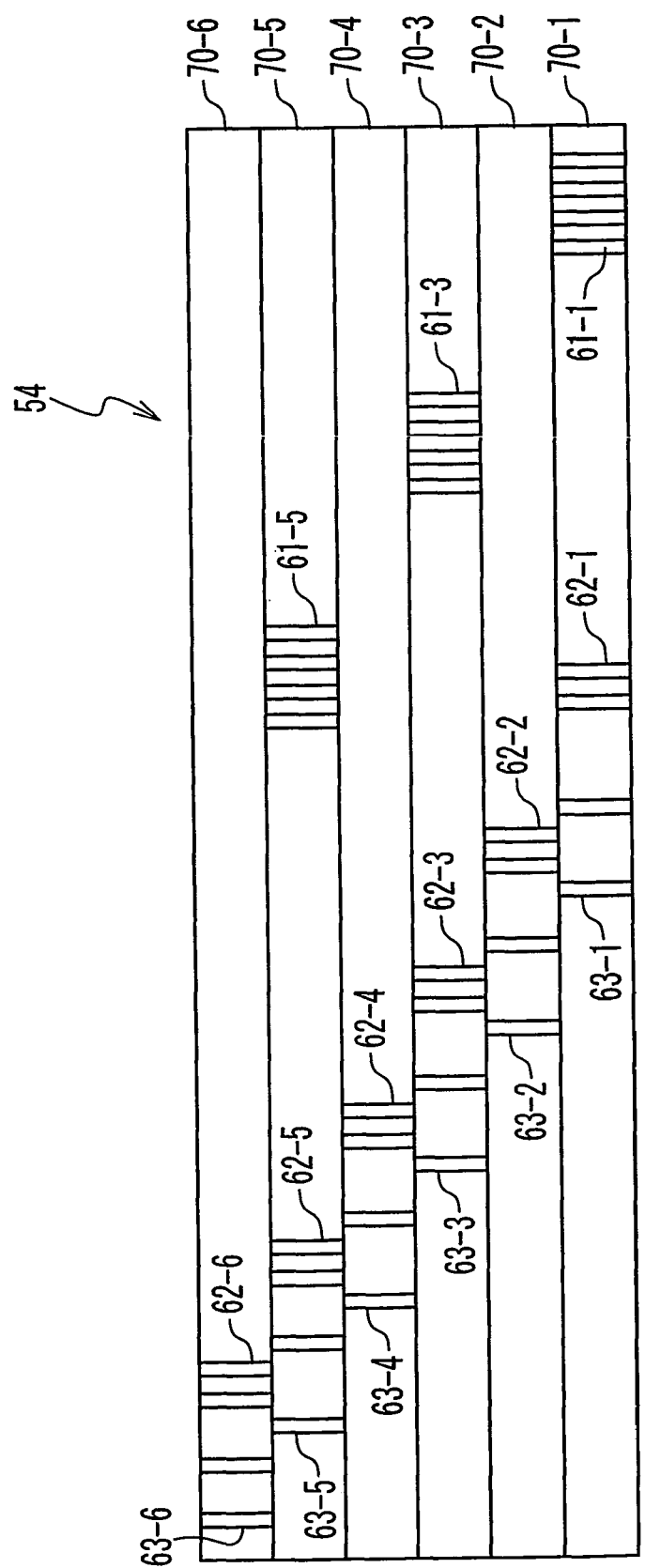
FIG. 4 is a cross sectional view showing another example of the scribe region 54 in FIG. 2.

The test units 4-1 to 4-$n$ test exposed patterns of the semiconductor wafers, each of which is exposed by one of the exposing units 3-1 to 3-$n$ to check their completeness and calculate the completeness value set M in the $1^{st}$ to $n^{th}$ exposure processes, respectively. The completeness value set M is outputted to the position aligning apparatus 2. The completeness value set M is calculated on the basis of a position relation between the position aligning check mark 63 of a lower-side pattern and the position aligning check mark 62 of an upper-side pattern (FIGS. 2 to 4). Specifically, regarding the semiconductor wafer exposed by the exposing unit 3-$j$, the $j^{th}$ test unit 4-$j$ calculates a completeness value set Mij of a $j^{th}$ pattern on the basis of a position relation between the position aligning check mark 63-(j-1) of a $(j-1)^{th}$ pattern and a position aligning check mark 62-$j$ of the $j^{th}$ pattern. In this regard, the completeness value set M detected by the $j^{th}$ pattern (the test unit 4-$j$) in the semiconductor wafer of the $i^{th}$ lot is referred to as Mij.

Next, the position aligning method (an operation of the position aligning apparatus) according to the present embodiment will be described.

At first, a calculating method of an exposure correction value set used for the position alignment will be described. In a following description, a case of the direct position aligning process and a case of the indirect position aligning process will be separately described as the position aligning method.

(A) Direct position aligning process (a) C(ShiftX), C(ShiftY), C(WaferScaleX), C(WaferScaleY), C(WaferRotation X), and C(WaferRotationY)

The correction value calculating section B 12 calculates the exposure correction value set C in the direct position aligning process to position misalignment (FIG. 5) with respect to the whole of a plurality of chip regions 53 by using the following equation (1):

$$Cij = C(i-1)j + M(i-1)j \quad (1)$$

where current lot is an $i^{th}$ lot, immediately-preceding lot is an $(i-1)^{th}$ lot, current process is a $j^{th}$ exposure process, Cij is the exposure correction value set of the $j^{th}$ process in the current $i^{th}$ lot, C(i-1)j is the exposure correction value set of the $j^{th}$ exposure process in the immediately-preceding $(i-1)^{th}$ lot, and M(i−1)j is the completeness value set of the $j^{th}$ exposure process in the immediately-preceding $(i-1)^{th}$ lot.

Meanwhile, the completeness value indicates magnitude of misalignment of a pattern formed in this position alignment from an appropriate position, and can be obtained by the same method as that of the completeness value described in FIG. 2 (same in the following description).

In addition, since the above-mentioned expression cannot be applied to a case of i=1, a preset value (for example, a value calculated on the basis of a past performance) is used. The preset value has been stored in the database 14.

Specifically, in the current $j^{th}$ process, the correction value calculating section B 12 calculates correction value set Cij of the current $i^{th}$ lot regarding each of the shift misalignment (ShiftX and ShiftY), the scale misalignment (WaferScaleX and WaferScaleY), and the rotation misalignment (WaferRotationX and WaferRotationY) on the pattern in the semiconductor wafer on the basis of a correction value set C(i−1)j of the current process ($j^{th}$ process) in the immediately-preceding $(i-1)^{th}$ lot and a completeness value set M(i−1)j of the current process ($j^{th}$ process) in the immediately-preceding $(i-1)^{th}$ lot.

For example, an exposure correction value set C33 has the following contents:

$$C33 = C23 + M23$$

where the current lot is a $3^{rd}$ lot, immediately-preceding lot is a $2^{nd}$ lot, the current process is a $3^{rd}$ exposure process, C33 is an exposure correction value set of the $3^{rd}$ exposure process in the current $3^{rd}$ lot, C23 is an exposure correction value set of the $3^{rd}$ exposure process in the immediately-preceding $2^{nd}$ lot, and M23 is a completeness value set of the $3^{rd}$ exposure process in the immediately-preceding $2^{nd}$ lot.

In this expression, a difference between an exposure correction value set C(i−1) and the completeness value set M(i−1) in a patterning in the immediately-preceding $(i-1)^{th}$ lot is employed as the exposure correction value set Cij in the current $i^{th}$ lot. This is based on supposition that a difference between the completeness values of the immediately-preceding lot and the current lot becomes approximately constant. Since each position misalignment of the pattern in the semiconductor wafer in the direct position aligning process has this tendency, the calculation using this equation is appropriate.

(b) C(ShotScaleX), C(ShotScaleY), C(ShotRotationX), and C(ShotRotationY)

The correction value calculating section A 11 calculates the exposure correction value set C in the direct position aligning process to the position misalignment (FIG. 6) with respect to the respective chip regions 53 by using the following equation (2):

$$Cij = C(i-1)j + M(i-1)j - (M(i-1)1 + \ldots + M(i-1)(j-1)) + (Mi1 + \ldots + Mi(j-1)) \qquad (2)$$

where current lot is an $i^{th}$ lot, immediately-preceding lot is an $(i-1)^{th}$ lot, current process is a $j^{th}$ exposure process, Cij is the exposure correction value set of the $j^{th}$ process in the current $i^{th}$ lot, C(i−1)j is the exposure correction value set of the $j^{th}$ exposure process in the immediately-preceding $(i-1)^{th}$ lot, M(i−1)j is the completeness value set of the $j^{th}$ exposure process in the immediately-preceding $(i-1)^{th}$ lot, M(i−1)1 + ... + M(i−1)(j−1) is a summation of the completeness value sets of the $1^{st}$ to $(j-1)^{th}$ exposure processes in the immediately-preceding $(i-1)^{th}$ lot, and Mi1 + ... + Mi(j−1) is a summation of the completeness value sets of the $1^{st}$ to $(j-1)^{th}$ exposure processes in the current $i^{th}$ lot.

Meanwhile, since the above-mentioned equation cannot be applied to a case of i=1, a preset value (for example, a value calculated on the basis of a past performance) is used. The preset value has been stored in the database 14. In addition, in case of j=1, $3^{rd}$ term or later in the above-mentioned equation (2) is ignored.

Specifically, in the current $j^{th}$ process, the correction value calculating section A 11 calculates the correction value set Cij of the current $i^{th}$ lot regarding each of the scale misalignment (ShotScaleX and ShotScaleY) and the rotation misalignment (ShotRotationX and ShotRotationY) of the pattern in a chip on the basis of: the correction value set C(i−1)j of the current $j^{th}$ process of the immediately-preceding $(i-1)^{th}$ lot; the completeness value set M(i−1)j of the current $j^{th}$ process of the immediately-preceding $(i-1)^{th}$ lot, the summation (M(i−1)1 + ... + M(i−1)(j−1)) of the completeness value sets M of the $1^{st}$ to $(j-1)^{th}$ processes to the current $j^{th}$ process in the immediately-preceding lot $((i-1)^{th})$; and the summation (Mi1 + ... + Mi(j−1)) of the completeness value sets M of the $1^{st}$ to $(j-1)^{th}$ processes to the current $j^{th}$ process in the current $i^{th}$ lot.

For example, an equation represented by:

$$C33 = C23 + M23 - (M21 + M22) + (M31 + M32)$$

has the following contents:
where the current lot is a $3^{rd}$ lot; the immediately-preceding lot is a $2^{nd}$ lot; current process is the $3^{rd}$ exposure process; C33 is an exposure correction value set of the $3^{rd}$ exposure process in the current $3^{rd}$ lot; C23 is an exposure correction value set of the $3^{rd}$ exposure process in the immediately-preceding $2^{nd}$ lot; M23 is a completeness value set of the $3^{rd}$ exposure process in the immediately-preceding $2^{nd}$ lot; M21+M22 is a summation of completeness value sets of the first to the second exposure processes in the immediately-preceding $2^{nd}$ lot; and M31+M32 is a summation of completeness value sets of the first to the second exposure processes in the current $3^{rd}$ lot.

In this equation, the exposure correction value Cij in the current $i^{th}$ lot is determined by further adding terms considering variations of the completeness value for each lot (a third term: −(M(i−1)1 + ... + M(i−1)(j−1)) and a fourth term: +(Mi1 + ... + Mi(j−1))) in addition to a difference between the exposure correction value set C(i−1)j and the completeness value set M(i−1)j in the patterning in the immediately-preceding $(i-1)^{th}$ lot. Specifically, a stack (a summation) of the completeness values of the immediately-preceding lot is removed by the third term, and a stack (a summation) of the completeness values of the current lot is added by the fourth term. This is because that the difference between the completeness values of the immediately-preceding lot and the current lot in the position misalignments regarding the chip regions 53 in the direct position aligning process (same as the indirect position aligning process as described above) cannot be ignored. For this reason, a correction based on the completeness values of the immediately-preceding lot (the summation of the completeness values of the first process to the immediately-preceding process) is removed, and a correction based on the completeness values of the current lot (the summation of the completeness values of the first process to the immediately-preceding process) is newly added.

(B) Indirect position aligning process (a) C(ShiftX), C(ShiftY), C(WaferScaleX), C(WAferScaleY), C(WaferRotationX), and C(WaferRotationY)

The correction value calculating section B 12 calculates the exposure correction value set C in the indirect position aligning process to the position misalignment (FIG. 5) with respect to the whole of a plurality of chip regions 53 by using the following equation (3):

$$Cij = C(i-1)j + M(i-1)j - M(i-1)(j-1) + Mi(j-1) \qquad (3)$$

where current lot is an $i^{th}$ lot, immediately-preceding lot is an $(i-1)^{th}$ lot, current process is the $j^{th}$ exposure process, Cij is the exposure correction value set of the $j^{th}$ process in the current $i^{th}$ lot, C(i–1)j is the exposure correction value of the $j^{th}$ exposure process in the immediately-preceding $(i-1)^{th}$ lot, M(i–1)j is the completeness value set of the $j^{th}$ exposure process in the immediately-preceding $(i-1)^{th}$ lot, M(i–1)(j–1) is the completeness value set of the $(j-1)^{th}$ exposure process in the immediately-preceding $(i-1)^{th}$ lot, and Mi(j–1) is the completeness value set of the $(j-1)^{th}$ exposure process in the current $i^{th}$ lot.

Meanwhile, since the above-mentioned equation cannot be applied to a case of i=1, a preset value (for example, a value calculated on the basis of a past performance) is used. The preset value has been stored in the database 14. In addition, in case of j=1, $3^{rd}$ term or later in the above-mentioned equation (2) is ignored.

Specifically, in the current $j^{th}$ process, the correction value calculating section B 12 calculates the correction value set Cij of the current $i^{th}$ lot regarding each of the shift misalignment (ShiftX and ShiftY), the scale misalignment (WaferScaleX and WaferScaleY), and the rotation misalignment (WaferRotationX and WaferRotationY) on the pattern in the semiconductor wafer on the basis of: a correction value set C(i–1)j of the current $j^{th}$ process in the immediately-preceding $(i-1)^{th}$ lot; a completeness value set M(i–1)j of the current $j^{th}$ process in the immediately-preceding $(i-1)^{th}$ lot; a completeness value set M(i–1)(j–1) of the immediately-preceding $(j-1)^{th}$ process in the immediately-preceding $(i-1)^{th}$ lot; and a completeness value set Mi(j–1) of the immediately-preceding $(j-1)^{th}$ process in the current $i^{th}$ lot.

For example, the exposure correction value C33 has following contents:

$$C33 = C23 + M23 - M22 + M32$$

where current lot is the $3^{rd}$ lot, immediately-preceding lot is the $2^{nd}$ lot, current process is the $3^{rd}$ exposure process, C33 is the exposure correction value set of the $3^{rd}$ exposure process in the current $3^{rd}$ lot, C23 is the exposure correction value set of the $3^{rd}$ exposure process in the immediately-preceding $2^{nd}$ lot, M23 is the completeness value set of the $3^{rd}$ exposure process in the immediately-preceding $2^{nd}$ lot, M22 is the completeness value set of the $2^{nd}$ exposure process in the immediately-preceding $2^{nd}$ lot, and M32 is the completeness value set of the $3^{rd}$ exposure process in the current $3^{rd}$ lot.

In this equation, the exposure correction value set Cij in the current $i^{th}$ lot is determined by further adding terms considering variations of the completeness values for each lot (the third term: –M(i–1)(j–1) and the fourth term: +Mi(j–1)) in addition to the difference between the exposure correction value set C(i–1)j and the completeness value set M(i–1)j in the patterning in the immediately-preceding $(i-1)^{th}$ lot. Specifically, a difference between the completeness value (the third term) in the patterning of the immediately-preceding process in the immediately-preceding lot and the completeness value (the fourth term) in the patterning of the immediately-preceding process in the current lot is added. This is because that the difference between the completeness values of the immediately-preceding lot and the current lot in the position misalignments with respect to the patterns in the semiconductor wafer in the indirect position aligning process cannot be ignored. For this reason, a correction based on the completeness values of the immediately-preceding lot (only the immediately-proceding process) is removed, and a correction based on the completeness values of the current lot (only the immediately-preceding process) is newly added.

(b) C(ShotScaleX), C(ShotScaleY), C(ShotRotationX), and C(ShotRotationY)

The correction value calculating section A 11 calculates the exposure correction value set C in the indirect position aligning process to position misalignment (FIG. 6) related to the respective chip regions 53 by using the above-mentioned equation (2), like the direct position aligning process. Since the detailed description is the same as that of the direct position aligning process, the description thereof will be omitted.

In addition, the respective values used in the above-mentioned equations (for example, C(i–1)j, M(i–1)j, M(i–1)1, ..., M(i–1)(j–1), Mi1, ..., Mi(j–1)) may be independent values or average values of a plurality of values. In case of the average value, the values may be stored in the database 14 as the average value, and past data stored in the database 14 may be averaged as necessary.

Next, the position aligning method (the operation of the position aligning apparatus) according to the present embodiment will be specifically described.

Figure 8:
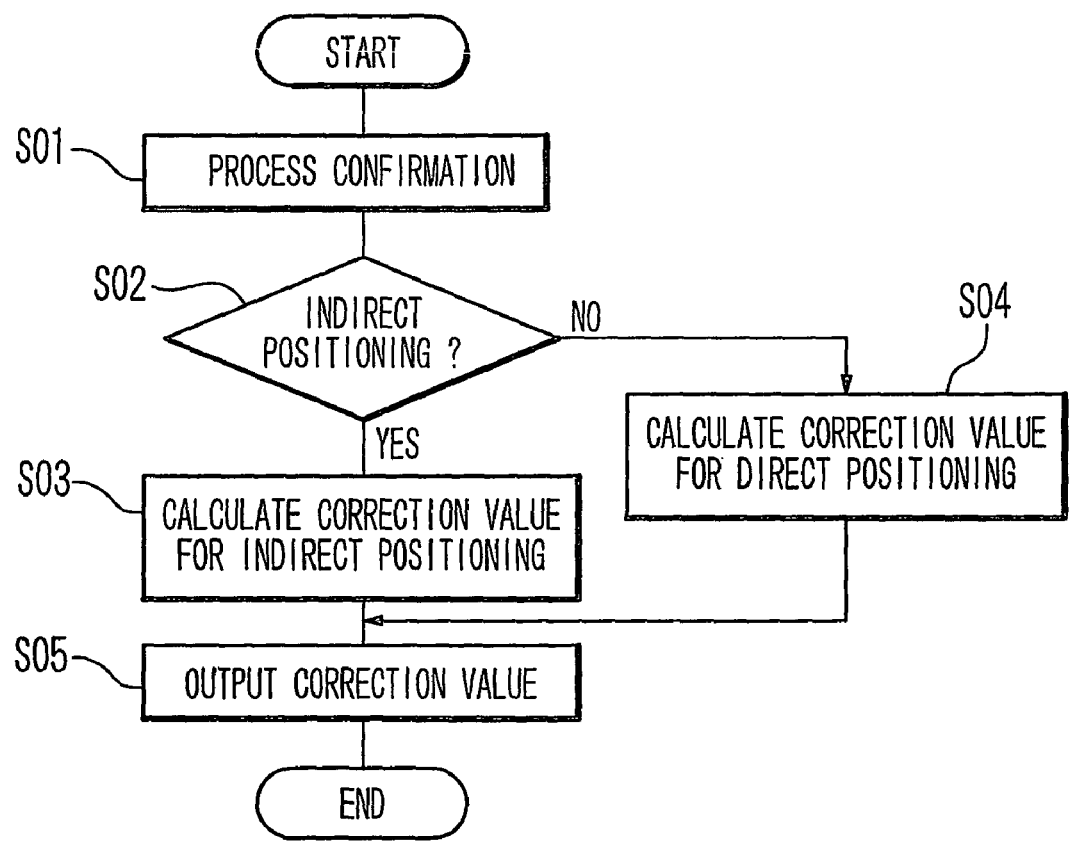
FIG. 8 is a flowchart showing a position aligning method (an operation of the position aligning apparatus) according to the present embodiment.

FIG. 8 is a flowchart showing the position aligning method (the operation of the position aligning apparatus) according to the present embodiment.

In this regard, the correction value calculating section A 11 and the correction value calculating section B 12 determine in each exposure process whether the process is the indirect position aligning process or the direct position aligning process, and outputs an appropriate exposure correction value set C to the respective exposing unit 3.

The correction value calculating section A 11 and the correction value calculating section B 12 confirms an exposure process that is a calculation object of the exposure correction value set (or the exposing unit that is an output object of the exposure correction value set) (step S01). Next, the correction value calculating section A 11 and the correction value calculating section B 12 confirms whether the exposure process is the indirect position aligning process or the direct position aligning process (step S02). The confirmation can be carried out by referring to a table relating data indicating the exposure process (or the exposing unit) to data indicating whether the process is the indirect position aligning process or the direct position aligning process, both of the data being stored in the database 14.

When the exposure process is the indirect position aligning process (step S02: Yes), the correction value calculating section B 12 calculates C(ShiftX), C(ShiftY), C(WaferScaleX), C(WaferScaleY), C(WaferRotationX), and C(WaferRotationY) by using the above-mentioned equation (3). In addition, the correction value calculating section A 11 calculates C(ShotScaleX), C(ShotScaleY) C(ShotRotationX), and C(ShotRotationY) by using the above-mentioned equation (2) (step S03).

When the exposure process is the direct position aligning process (step S02: No), the correction value calculating section B 12 calculates C(ShiftX), C(ShiftY), C(WaferScaleX), C(WaferScaleY), C(WaferRotationX), and C(WaferRotationY) by using the above-mentioned equation (1). In addition, the correction value calculating section A 11 calculates C(ShotScaleX), C(ShotScaleY) C(ShotRotationX), and C(ShotRotationY) by using the above-mentioned equation (2) (step S04).

The control section 13 outputs the calculated exposure correction value set C(C(ShiftX), C(ShiftY), C(WaferScaleX), C(WaferScaleY), C(WaferRotationX), C(WaferRotationY), C(ShotScaleX), C(ShotScaleY), C(ShotRotationX), and C(ShotRotationY)) to the exposing unit 3 that is an output object of the exposure correction value (step S05).

Subsequently, an operation of the exposure system according to the present embodiment will be specifically described.

Figure 9:
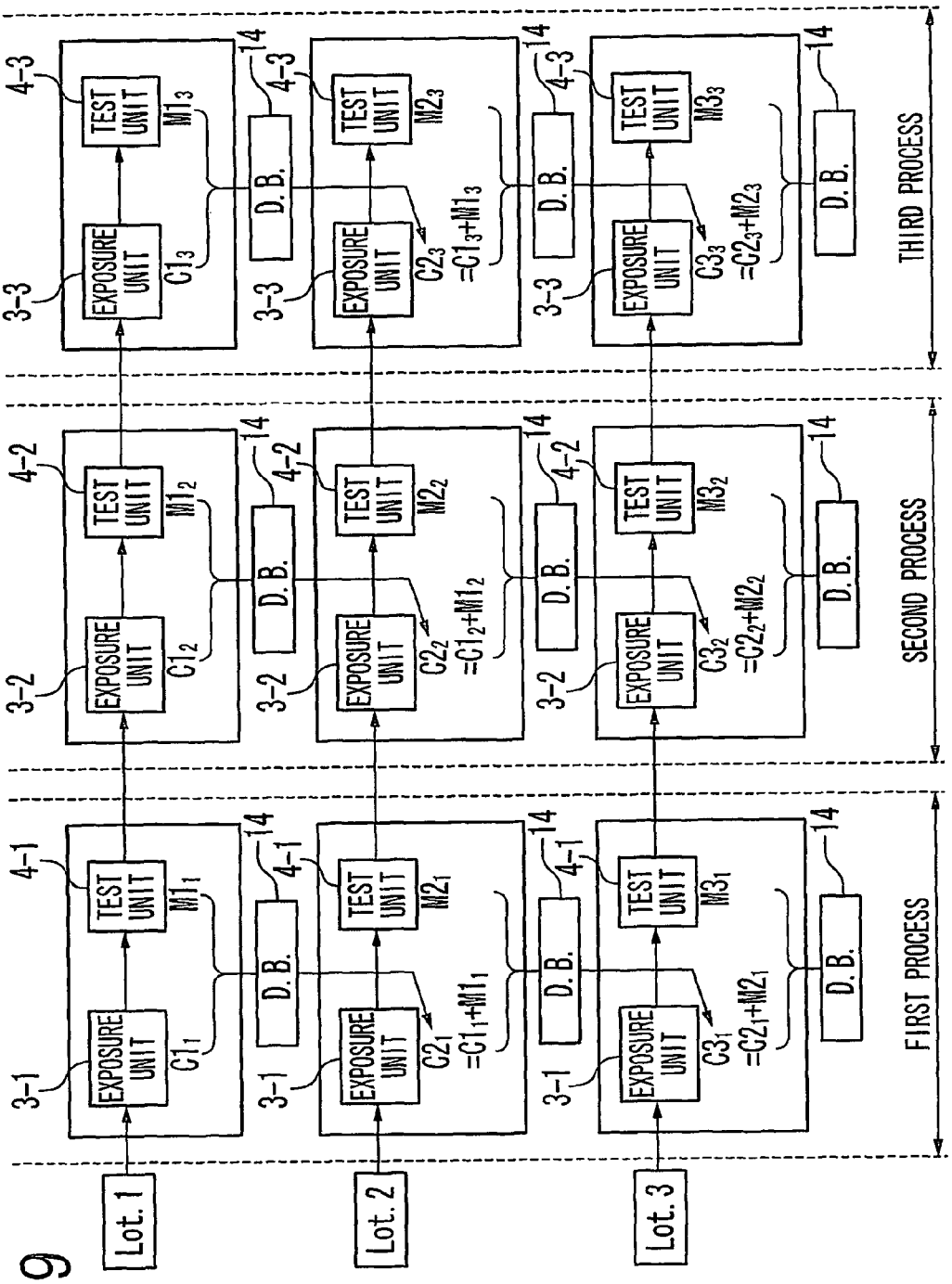
FIG. 9 is a schematic diagram showing an operation of an exposure system according to the present embodiment.
Figure 10:
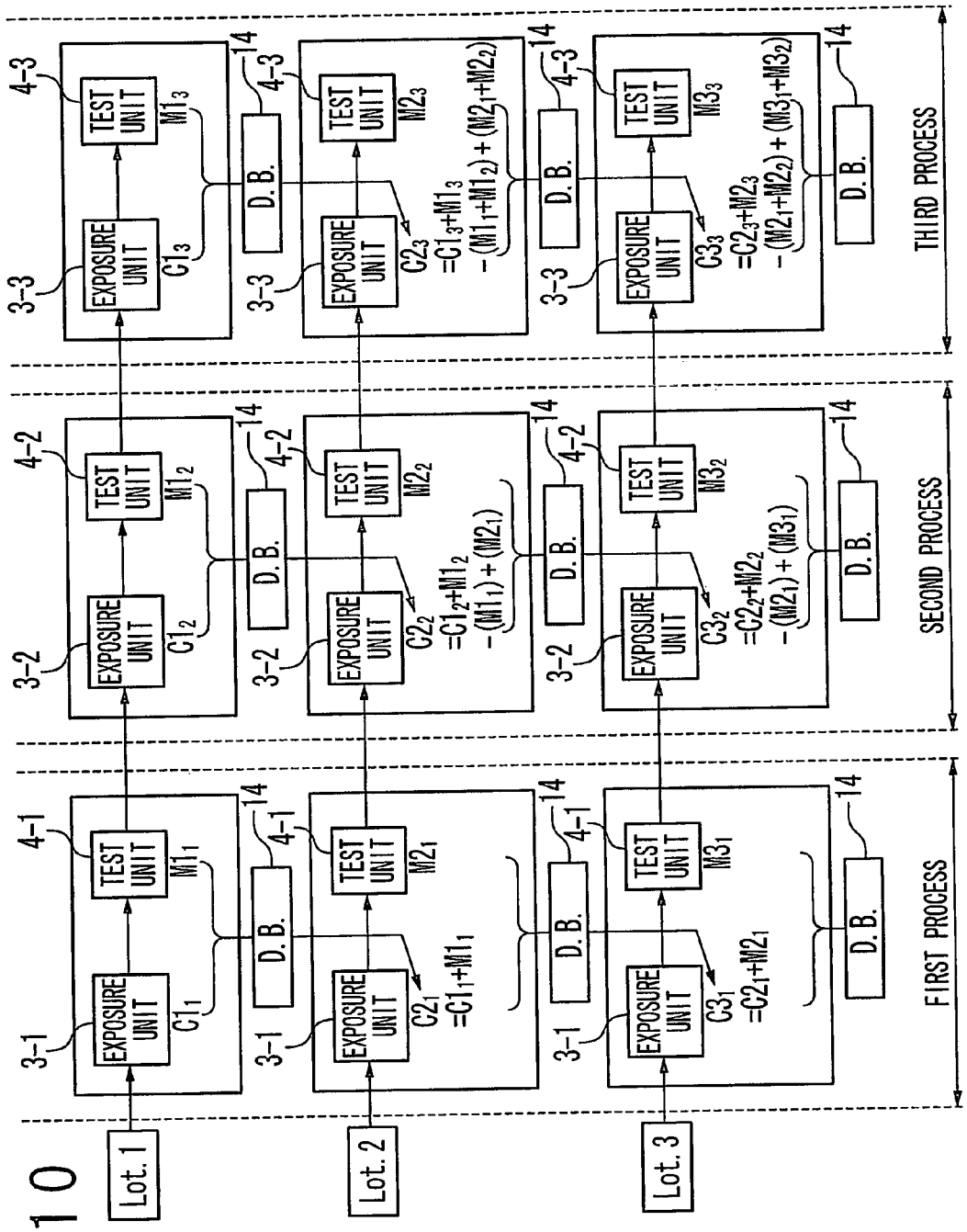
FIG. 10 is a schematic diagram showing an operation of the exposure system according to the present embodiment.
Figure 11:
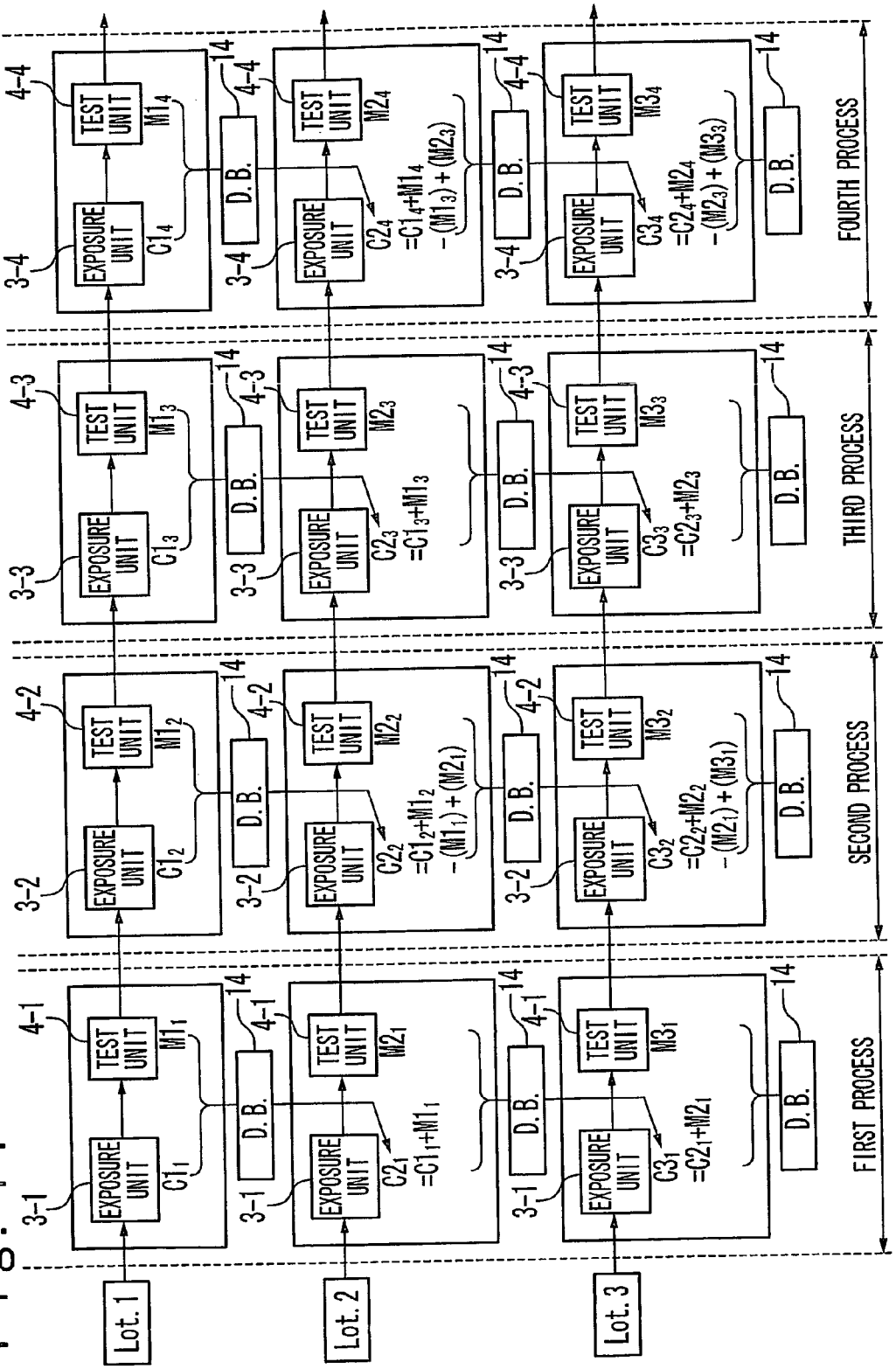
FIG. 11 is a schematic diagram showing an operation of the exposure system according to the present embodiment.

FIGS. 9 to 11 are schematic diagrams showing the operation of the exposure system according to the present embodiment.

At first, a case where all of the exposure processes are the direct position aligning process will be described.

FIG. 9 shows a flow regarding C(ShiftX), C(ShiftY), C(WaferScaleX), C(WaferScaleY), C(WaferRotationX), and C(WaferRotationY) shown in the above-mentioned A(a). In addition, though not shown in the drawing, processes such as film formation and etching are carried out as necessary after the tests by the respective test units 4 and before arrival to the next exposing unit 3.

In a first lot (Lot. 1), the correction value calculating section B 12 outputs the exposure correction value sets C11, C12, C13, . . . to the exposing unit 3-1, 3-2, 3-3, . . . in the respective exposure processes. As the exposure correction value sets C11, C12, C13, . . . , preset values (for example, values calculated on the basis of a past performance) are used. The preset values have been stored in the database 14, and are read out by the correction value calculating section B 12. The exposing unit 3-1, 3-2, 3-3, . . . carry out the exposure after correcting the position misalignment by using the exposure correction value sets C11, C12, and C13. The test units 4-1, 4-2, 4-3, . . . calculate the completeness value sets M11, M12, M13, . . . by a check after the exposure. The database 14 stores the exposure correction value sets C (C11, C12, C13, . . . ) and the completeness value sets M (M11, M12, M13, . . . ) by relating the values to the exposure processes (the first, second, third, . . . ) and the lot number (the first).

In a second lot (Lot. 2), the correction value calculating section B 12 outputs the exposure correction value sets C21, C22, C23, . . . to the exposing unit 3-1, 3-2, 3-3, . . . in the respective exposure processes. The exposure correction value sets C21, C22, C23, . . . are calculated by using the above-mentioned equation (1): Cij=C(i−1)j+M(i−1)j. Because i=2 and j=1, 2, 3, . . . , the equation is specifically represented as C21=C11+M11, C22=C12+M12, C23=C12+M13, . . . . However, respective values in the equations are read from the database 14 by the correction value calculating section B 12. The exposing unit 3-1, 3-2, 3-3, . . . carry out the exposure after correcting the position misalignment by using the exposure correction value sets C21, C22, and C23. The test units 4-1, 4-2, 4-3, . . . calculate the completeness value sets M21, M22, M23, . . . through a check after the exposure. The database 14 stores the exposure correction value sets C (C21, C22, C23, . . . ) and the completeness value sets M (M21, M22, M23, . . . ) by relating the values to the exposure processes (the first, second, third, . . . ) and the lot number (the second).

In a third lot (Lot. 3), the correction value calculating section B 12 outputs the exposure correction value sets C31, C32, C33, . . . to the exposing unit 3-1, 3-2, 3-3, . . . in the respective exposure processes. The exposure correction value sets C31, C32, C33, . . . is calculated by using the above-mentioned equation (1): Cij=C(i−1)j+M(i−1)j. Because i=3 and j=1, 2, 3, . . . , the equation is specifically represented as C31=C21+M21, C32=C22+M22, C33=C22+M23, . . . . However, respective values in the equations are read from the database 14 by the correction value calculating section B 12. The exposing unit 3-1, 3-2, 3-3, . . . carry out the exposure after correcting the position misalignment by using the exposure correction value sets C31, C32, and C33. The test units 4-1, 4-2, 4-3, . . . calculate the completeness value sets M31, M32, M33, . . . by a check after the exposure. The database 14 stores the exposure correction value sets C (C31, C32, C33, . . . ) and the completeness value sets M (M31, M32, M33, . . . ) by relating the values to the exposure processes (the first, second, third, . . . ) and the lot number (the third).

In a fourth lot or later, the same processing can be carried out.

FIG. 10 shows a flow regarding C(ShotScaleX), C(ShotScaleY), C(ShotRotationX), and C(ShotRotationY) shown in the above-mentioned A(b). In addition, though not shown in the drawing, processes such as film formation and etching are carried out as necessary after the tests by the respective test units 4 and before arrival to the next exposing unit 3.

In the first lot (Lot. 1), the correction value calculating section A 11 outputs the exposure correction value sets C11, C12, C13, . . . to the exposing unit 3-1, 3-2, 3-3, . . . in the respective exposure processes. As the exposure correction value sets C11, C12, C13, . . . , preset values (for example, a value calculated on the basis of a past performance) are used. The preset values have been stored in the database 14, and are read by the correction value calculating section A 11. The exposing unit 3-1, 3-2, 3-3, . . . carry out the exposure after correcting the position misalignment by using the exposure correction value sets C11, C12, and C13. The test units 4-1, 4-2, 4-3, . . . calculate the completeness value sets M11, M12, M13, . . . by a check after the exposure. The database 14 stores the exposure correction value sets C (C11, C12, C13, . . . ) and the completeness value sets M (M11, M12, M13, . . . ) by relating the values to the exposure processes (the first, second, third, . . . ) and the lot number (the first).

In the second lot (Lot. 2), the correction value calculating section A 11 outputs the exposure correction value sets C21, C22, C23, . . . to the exposing unit 3-1, 3-2, 3-3, . . . in the respective exposure processes. The exposure correction value sets C21, C22, C23, . . . is calculated by using the above-mentioned equation (2): Cij=C(i−1)j+M(i−1)j−(M(i−1)1+ . . . +M(i−1)(j−1))+(Mi1+ . . . +Mi(j−1)). Regarding the exposure correction value set C21, equation (2) does not have the third term or later because j−1=0. Because i=2 and j=1, 2, 3, . . . , the equation is specifically represented as C21=C11+M11, C22=C12+M12−(M11)+(M21), C23=C13+M13−(M11+M12)+(M21+M22), . . . . However, respective values in the equations are read from the database 14 by the correction value calculating section A 11. The exposing unit 3-1, 3-2, 3-3, . . . carry out the exposure after correcting the position misalignment by using the exposure correction value sets C21, C22, C23, . . . . The test units 4-1, 4-2, 4-3, . . . calculate the completeness value sets M21, M22, M23, . . . by a check after the exposure. The database 14 stores the exposure correction value sets C (C21, C22, C23, . . . ) and the completeness value sets M (M21, M22, M23, . . . ) by relating the values to the exposure processes (the first, second, third, . . . ) and the lot number (the second).

In the third lot (Lot. 3), the correction value calculating section A 11 outputs the exposure correction value sets C31, C32, C33, . . . to the exposing unit 3-1, 3-2, 3-3, . . . in the respective exposure processes. The exposure correction value sets C31, C32, C33, . . . is calculated by using the above-mentioned equation (2): Cij=C(i−1)j+M(i−1)j−(M(i−1)1+ . . . +M(i−1)(j−1))+(Mi1+ . . . +Mi(j−1)). Regarding the exposure correction value set C31, equation (2) does not have the third term or later because j−1=0. Because i=3 and j=1, 2, 3, . . . , the equation is specifically represented as C31=C21+M21, C32=C22+M22−(M21)+(M31), C33=C23+M23−(M21+M22)+(M31+M32), . . . . However, respective values in the equations are read from the database 14 by the correction value calculating section A 11. The exposing unit 3-1, 3-2, 3-3, . . . carry out the exposure after correcting the position misalignment by using the exposure correction value sets C31, C32, C33, . . . . The test units 4-1, 4-2, 4-3, . . . calculate the completeness value sets M21, M22, M23, . . . by a check after the exposure. The database 14 stores the exposure correction value sets C (C31, C32, C33, . . . ) and the completeness value sets M (M31, M32, M33, . . . ) by relating the values to the exposure processes (the first, second, third, . . . ) and the lot number (the second).

In a fourth lot or later, the same processing can be carried out.

Subsequently, a case where the exposure process alternately carries out the direct position aligning process (an odd-numbered process) and the indirect position aligning process (an even-numbered process) will be described.

FIG. 11 shows a flow regarding C(ShiftX), C(ShiftY), C(WaferScaleX), C(WaferScaleY), C(WaferRotationX), and C(WaferRotationY) shown in each of the above-mentioned A(a) of the direct position aligning process and the above-mentioned B(a) of the indirect position aligning process. In addition, though not shown in the drawing, processes such as film formation and etching are carried out as necessary after the tests by the respective test units 4 and before arrival to the next exposing unit 3.

In the first lot (Lot. 1), the correction value calculating section B 12 outputs the exposure correction value sets C11, C12, C13, . . . to the exposing unit 3-1, 3-2, 3-3, . . . in the respective exposure processes. As the exposure correction value sets C11, C12, C13, . . . , preset values (for example, a value calculated on the basis of a past performance) are used. The preset values have been stored in the database 14, and are read by the correction value calculating section B 12. The exposing unit 3-1, 3-2, 3-3, . . . carry out the exposure after correcting the position misalignment by using the exposure correction value sets C11, C12, and C13. The test units 4-1, 4-2, 4-3, . . . calculate the completeness value sets M11, M12, M13, . . . by a check after the exposure. The database 14 stores the exposure correction value sets C (C11, C12, C13, . . . ) and the completeness value sets M (M11, M12, M13, . . . ) by relating the values to the exposure processes (the first, second, third, . . . ) and the lot number (the first).

In the second lot (Lot. 2), the correction value calculating section B 12 outputs the exposure correction value sets C21, C23, . . . to the exposing unit 3-1, 3-3, . . . for carrying out the direct position aligning process in the respective exposure processes. The exposure correction value sets C21, C23, . . . are calculated by using the above-mentioned equation (1): $Cij=C(i-1)j+M(i-1)j$. Because i=2 and j=1, 3, . . . , the equation is specifically represented as C21=C11+M11, C23=C13+M13, . . . .

On the other hand, the correction value calculating section B 12 outputs the exposure correction value sets C22, C24, . . . to the exposing unit 3-2, 3-4, . . . for carrying out the indirect position aligning process. The exposure correction value sets C22, C24, . . . are calculated by using the above-mentioned equation (3): $Cij=C(i-1)j+M(i-1)j-M(i-1)(j-1)+Mi(j-1)$. Because i=2 and j=2, 4, . . . , the equation is specifically represented as C22=C12+M12−(M11)+(M21), C24=C14+M14−(M13)+(M23), . . . .

However, respective values in the equations are read from the database 14 by the correction value calculating section B 12. The exposing unit 3-1, 3-2, 3-3, 3-4, . . . carry out the exposure after correcting the position misalignment by using the exposure correction value sets C21, C22, C23, C24, . . . . The test units 4-1, 4-2, 4-3, 4-4, . . . calculate the completeness value sets M21, M22, M23, M24, . . . by a check after the exposure. The database 14 stores the exposure correction value sets C (C21, C22, C23, C24, . . . ) and the completeness value sets M (M21, M22, M23, M24, . . . ) by relating the values to the exposure processes (the first, second, third, . . . ) and the lot number (the second).

In the third lot (Lot. 3), the correction value calculating section B 12 outputs the exposure correction value sets C31, C33, . . . to the exposing unit 3-1; 3-3, . . . for carrying out the direct position aligning process in the respective exposure processes. The exposure correction value sets C31, C33, . . . are calculated by using the above-mentioned equation (1): $Cij=C(i-1)j+M(i-1)j$. Because i=3 and j=1, 3, . . . , the equation is specifically represented as C31=C21+M21, C33=C23+M23, . . . .

On the other hand, the correction value calculating section B 12 outputs the exposure correction value sets C32, C34, . . . to the exposing unit 3-2, 3-4, . . . for carrying out the indirect position aligning process. The exposure correction value sets C32, C34, . . . is calculated by using the above-mentioned equation (3): $Cij=C(i-1)j+M(i-1)j-M(i-1)(j-1)+Mi(j-1)$. Because i=3 and j=2, 4, . . . , the equation is specifically represented as C32=C22+M22−(M21)+(M31), C34=C24+M24−(M23)+(M33), . . . .

However, respective values in the equations are read from the database 14 by the correction value calculating section B 12. The exposing unit 3-1, 3-2, 3-3, 3-4, . . . carry out the exposure after correcting the position misalignment by using the exposure correction value sets C31, C32, C33, C34, . . . . The test units 4-1, 4-2, 4-3, 4-4, . . . calculate the completeness value sets M31, M32, M33, M34, . . . by a check after the exposure. The database 14 stores the exposure correction value sets C (C31, C32, C33, C34, . . . ) and the completeness value sets M (M31, M32, M33, M34, . . . ) by relating the values to the exposure processes (the first, second, third, . . . ) and the lot number (the third).

In a fourth lot or later, the same processing can be carried out.

As for C(ShotScaleX), C(ShotScaleY), C(ShotRotationX), and C(ShotRotationY) shown in the above-mentioned B(b) in the indirect position aligning process, they are the same as those shown in the above-mentioned A(a). Accordingly, since the case where the exposure process alternately carries out the direct position aligning process (the odd-numbered process) and the indirect position aligning process (the even-numbered process) is the same as the case of the direct position aligning process in FIG. 9, the description thereof will be omitted.

Next, a relationship between the exposure correction value obtained in the embodiment of the present invention and an optimum correction value will be described. In this regard, an optimum correction value set $Cij0$ is a summation of the exposure correction value set Cij and the completeness value set Mij in the same $i^{th}$ lot and in the same $j^{th}$ process. That is, $Cij0=Cij+Mij$.

Figure 12:
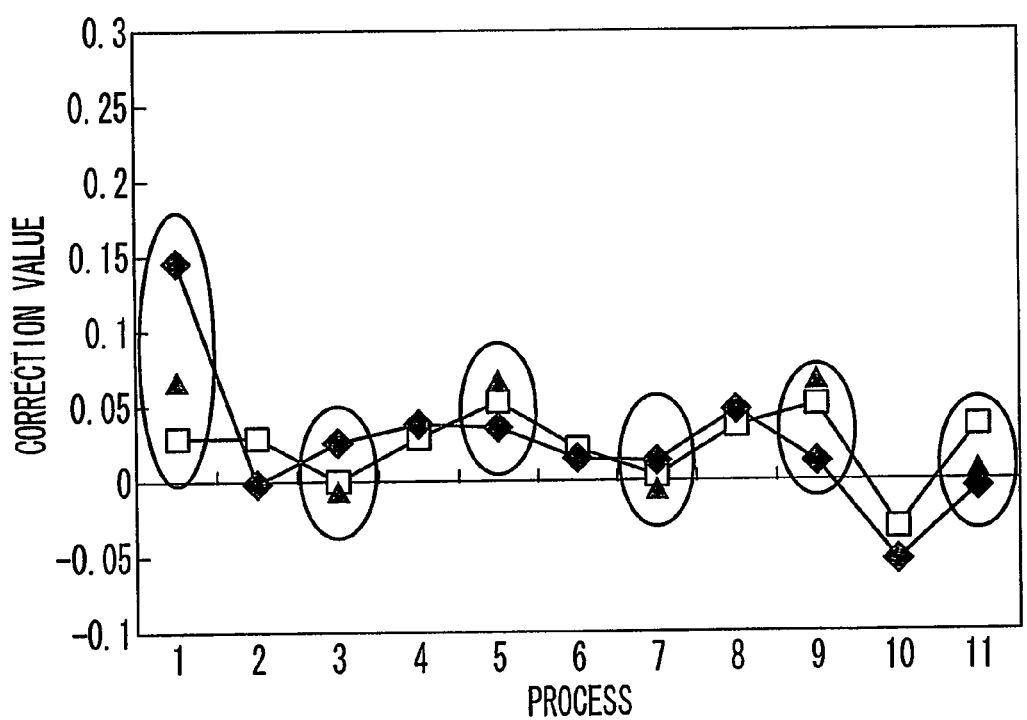
FIG. 12 is a graph showing one example of a relationship between an exposure correction value set and an optimum correction value set.

FIG. 12 is a graph showing one example of a relationship between the exposure correction value and the optimum correction value. A vertical axis represents a correction value, and a horizontal axis represents a process. A rhombic shape indicates the exposure correction value in the above-mentioned equation (1), a triangular shape indicates the exposure correction value in the above-mentioned equation (3), and a square shape indicates the optimum correction value. A process in an ellipse mark represents the indirect position aligning process. This drawing represents C(WaferRotationX). However, C(ShiftX), C(ShiftY), C(WaferScaleX), C(WaferScaleY), and C(WaferRotationY) show a similar tendency.

If all processes are carried out by using only the direct position aligning process, when the rhombic shape (the exposure correction value in equation (1)) is compared with the square shape (the optimum correction value) in the all processes (a set of the rhombic shapes connected by a line segment), it can be found that their tendencies of increase and decrease are quite similar and a difference between them is small. That is, when the exposure correction value C(WaferRotationX) in the direct position aligning process is obtained, the value can be extremely close to the optimum correction value by using above-mentioned equation (1).

On the other hand, if all the processes are carried out by alternating the indirect position aligning process (processes 1, 3, 5, 7, 9, and 11) and the direct position aligning process (processes 2, 4, 6, 8, and 10), when the triangular shape (equation (3)) is compared with the square shape (the optimum correction value) in the indirect position aligning process (a portion in the ellipse shape), it can be found that their tendencies of increase and decrease are further quite similar and a difference between them is further small. That is, when the exposure correction value C(WaferRotationX) in the indirect position aligning process is obtained, the value can be further extremely close to the optimum correction value by using not above-mentioned equation (1) but above-mentioned equation (3).

Figure 13:
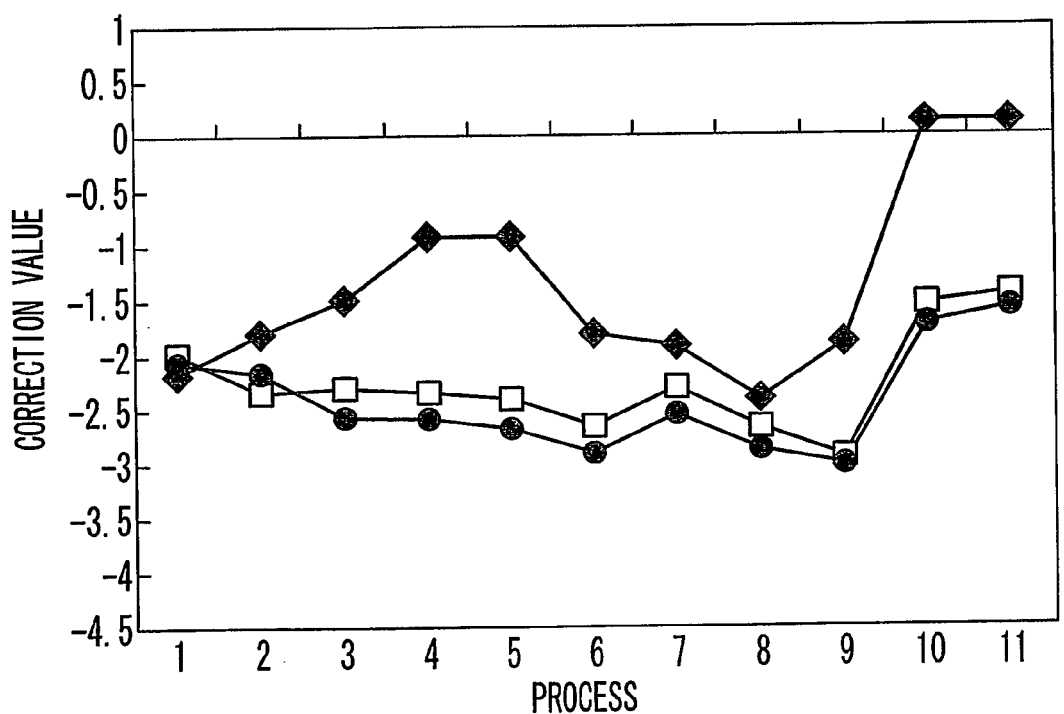
FIG. 13 is a graph showing another example of the relationship between the exposure correction value set and the optimum correction value set.

FIG. 13 is a graph showing another example of a relationship between the exposure correction value and the optimum correction value. A vertical axis represents a correction value, and a horizontal axis represents a process. A rhombic shape indicates the exposure correction value in above-mentioned equation (1), a circular shape indicates the exposure correction value in above-mentioned equation (2), and a square shape indicates the optimum correction value. This drawing represents C(ShotRotationX). However, C(ShotScaleX), C(ShotScaleY), and C ShotRotationY) show a similar tendency.

If all processes are carried out by using only the direct position aligning process, when the circular shape (equation (2)) is compared with the square shape (the optimum correction value) in the all processes (a set of the circular shapes connected by a line segment), it can be found that their tendencies of increase and decrease are quite similar and a difference between them is small. On the other hand, it can be found that the exposure correction value of above-mentioned equation (1) described as a comparative example is widely different from the optimum correction value. That is, when the exposure correction value C(ShotRotationX) in the direct position aligning process is obtained, the value can be extremely close to the optimum correction value by using above-mentioned equation (2).

The above-described tendency is similar to that of the case where the all processes are carried out by alternating the indirect position aligning process (processes 1, 3, 5, 7, 9, and 11) and the direct position aligning process (processes 2, 4, 6, 8, and 10). That is, if the exposure correction value C(ShotRotationX) in the indirect position aligning process is obtained, the value can be extremely close to the optimum correction value when obtaining the value by using above-mentioned equation (2) in the similar manner.

In the method of Japanese Patent Application Publication (JP-P2006-73986A), the correction parameter in the current lot (Lj) is calculated by using the preset correction parameter and the completeness value regarding the immediately-preceding lot L(j−1) to correct the preset correction parameter regarding the current lot Lj. That is, the correction value of the current lot is corrected on the basis of only a numeric value regarding the immediately-preceding lot L(j−1). For this reason, when there is a difference between the immediately-preceding lot and the current lot, the correction value of the current lot may be negatively affected by the difference. Additionally, Japanese Patent Application Publication (JP-P2006-73986A) includes a description considering the difference between the immediately-preceding lot and the current lot, however, special processing for preliminarily knowing a tendency between the respective lots by regularly processing a reference wafer is required.

However, especially in the present invention, each of C(ShotScaleX), C(ShotScaleY), C(ShotRotationX), and C(ShotRotationY) of the direct position aligning process and the indirect position aligning process and C(ShiftX), C(ShiftY), C(WaferScaleX), C(WaferScaleY), C(WaferRotationX), and C(WaferRotationY) of the indirect position aligning process is calculated in consideration of the difference between the immediately-preceding lot and the current lot (the variations of completeness for each lot) (equations (2) and (3)). As the result, the position alignment can be carried out with extremely-high accuracy.

According to the present invention, in the exposure process, factors to be considered and corrected in the exposure can be specified in each of the cases of the direct position aligning process and the indirect position aligning process, and an accuracy of the position alignment for the patter can be extremely improved.

The program and the data structure in the present invention may be stored in a storage medium that can be read by a computer and may be read from the storage medium by an information processing device.

Although the present invention has been described above in connection with several embodiments thereof, it would be apparent to those skilled in the art that those embodiments are provided solely for illustrating the present invention, and should not be relied upon to construe the appended claims in a limiting sense.

What is claimed is:

1. A method of manufacturing a semiconductor device, said method comprising:
   position aligning a pattern of a semiconductor wafer in a current process of a pattern exposure process using information on a pattern that is formed before the current process; and
   exposing the semiconductor wafer,
   wherein said position aligning comprises:
      calculating a correction value set of a current lot for each of misalignments in a scale and a rotation of the pattern in a chip in the current process based on a correction value set in an immediately-preceding lot in the current process, a completeness value set in the immediately-preceding lot in the current process, a summation of completeness value sets for preceding processes to the current process in the immediately-preceding lot, and a summation of completeness value sets for preceding processes to the current process in the current lot; and
      controlling a correction of a shift, the scale, and the rotation of the pattern in the chip by using the correction value sets.

2. The method according to claim 1, further comprising:
   calculating other correction value sets of misalignments in the scale and the rotation in the current process based on a correction value set in the immediately-preceding lot in the current process, the completeness value set in the immediately-preceding lot in the current process, a summation of completeness value sets for preceding processes to the current process in the immediately-preceding lot, and a summation of completeness value sets completeness value sets for preceding processes to the current process in the current lot; and controlling the correction of the scale and the rotation of the pattern in the chip by using the other correction value sets.

3. The method according to claim 1, further comprising:
relating the correction value set and the completeness value set in each of processes of the exposure process to an exposure unit for the exposure process and a lot number of the exposure process to store in a database.

4. The method according to claim 1, wherein the position alignment of the pattern in the current process is performed by using a pattern formed in the immediately-preceding process.

5. The claim according to claim 1, further comprising:
calculating other correction value sets of misalignments in the shift, the scale, and the rotation in the current process based on a correction value set in the immediately-preceding lot in the current process, and the completeness value set in the immediately-preceding lot in the current process; and
controlling the correction of the scale and the rotation of the pattern in the chip by using the other correction value sets.

6. The method according to claim 1, wherein an exposure correction value set $Cij$ of a $j^{th}$ exposure process in a current $i^{th}$ lot is calculated based on $$Cij = C(i-1)j + M(i-1)j - (M(i-1)1 + \ldots + M(i-1)(j-1)) + (Mi1 + \ldots + Mi(j-1))$$

where the current lot is an $i^{th}$ lot, the immediately-preceding lot is an $(i-1)^{th}$ lot, the current process is a $j^{th}$ exposure process, $C(i-1)j$ is an exposure correction value set of a $j^{th}$ exposure process in an immediately-preceding $(i-1)^{th}$ lot, $M(i-1)j$ is a completeness value set of the $j^{th}$ exposure process in the immediately-preceding $(i-1)^{th}$ lot, $M(i-1)1 + \ldots + M(i-1)(j-1)$ is a summation of completeness value sets of a $1^{st}$ to $(j-1)^{th}$ exposure processes in an immediately-preceding $(i-1)^{th}$ lot, and $Mi1 + \ldots + Mi(j-1)$ is a summation of the completeness value sets of the $1^{st}$ to $(j-1)^{th}$ exposure processes in the current $i^{th}$ lot.

7. A method of manufacturing a semiconductor device, said method comprising:
position aligning a pattern of a semiconductor wafer in a current process of a pattern exposure process using a information on a pattern that is formed before an immediately-preceding process to the current process; and
exposing the semiconductor wafer,
wherein said position aligning comprises:
calculating a correction value set of a current lot for each of misalignments in a shift, a scale, and a rotation of the pattern in a chip in the current process based on a correction value set in an immediately-preceding lot in the current process, a completeness value set in the immediately-preceding lot in the current process, a completeness value set in the immediately-preceding lot in the immediately-preceding process, and a completeness value set in the current lot to the immediately-preceding process; and
controlling a correction of the shift, the scale, and the rotation of the pattern in the chip by using the correction value sets.

8. The method according to claim 7, further comprising:
calculating other correction value sets of misalignments in the scale and the rotation in the current process based on a correction value set in the immediately-preceding lot in the current process, the completeness value set in the immediately-preceding lot in the current process, a summation of completeness value sets for preceding processes to the current process in the immediately-preceding lot, and a summation of completeness value sets completeness value sets for preceding processes to the current process in the current lot; and
controlling the correction of the scale and the rotation of the pattern in the chip by using the other correction value sets.

9. The method according to claim 7, further comprising:
relating the correction value set and the completeness value set in each of processes of the exposure process to an exposure unit for the exposure process and a lot number of the exposure process to store in a database.

10. The method according to claim 7, wherein the position alignment of the pattern in the current process is performed by using a pattern formed in the immediately-preceding process.

11. The claim according to claim 7, further comprising:
calculating other correction value sets of misalignments in the shift, the scale, and the rotation in the current process based on a correction value set in the immediately-preceding lot in the current process, and the completeness value set in the immediately-preceding lot in the current process; and
controlling the correction of the scale and the rotation of the pattern in the chip by using the other correction value sets.

12. The method according to claim 7, wherein an exposure correction value set $Cij$ of a $j^{th}$ exposure process in a current $i^{th}$ lot is calculated based on $$Cij = C(i-1)j + M(i-1)j - M(i-1)(j-1) + Mi(j-1)$$

where the current lot is an $i^{th}$ lot, the immediately-preceding lot is an $(i-1)^{th}$ lot, the current process is the $j^{th}$ exposure process, $C(i-1)j$ is an exposure correction value of the $j^{th}$ exposure process in an immediately-preceding $(i-1)^{th}$ lot, $M(i-1)j$ is the completeness value set of the $j^{th}$ exposure process in the immediately-preceding $(i-1)^{th}$ lot, $M(i-1)(j-1)$ is the completeness value set of a $(j-1)^{th}$ exposure process in the immediately-preceding $(i-1)^{th}$ lot, and $Mi(j-1)$ is the completeness value set of the $(j-1)^{th}$ exposure process in the current $i^{th}$ lot.

* * * * *